United States Patent [19]
Jennings

[11] Patent Number: 5,985,728
[45] Date of Patent: Nov. 16, 1999

[54] SILICON ON INSULATOR PROCESS WITH RECOVERY OF A DEVICE LAYER FROM AN ETCH STOP LAYER

[75] Inventor: Dean Jennings, San Ramon, Calif.

[73] Assignee: Elantec Semiconductor, Inc., Milpitas, Calif.

[21] Appl. No.: 08/522,728

[22] Filed: Sep. 1, 1995

[51] Int. Cl.$^6$ .......................... H01L 21/22; H01L 21/225
[52] U.S. Cl. .......................... 438/311; 438/368; 438/370; 438/371; 438/473; 438/510; 438/517; 438/545; 438/526; 438/542; 438/914; 438/967; 257/347; 257/607
[58] Field of Search ..................................... 438/311, 368, 438/370, 371, 473, 510, 517, 545, 546, 526, 914, 967, 542; 257/347, 607

[56] References Cited

U.S. PATENT DOCUMENTS

| | | | |
|---|---|---|---|
| 4,601,779 | 7/1986 | Abernathy et al. | 156/628 |
| 4,638,552 | 1/1987 | Shimbo et al. | 29/576 |
| 4,771,016 | 9/1988 | Bajor et al. | 437/180 |
| 4,851,078 | 7/1989 | Short et al. | 156/632 |
| 4,883,215 | 11/1989 | Goesele et al. | 228/116 |
| 4,888,304 | 12/1989 | Nakagawa et al. | 437/86 |
| 4,939,101 | 7/1990 | Black et al. | 437/62 |
| 4,962,879 | 10/1990 | Goesele et al. | 228/116 |
| 4,987,093 | 1/1991 | Teng | 437/69 |
| 5,013,681 | 5/1991 | Godbey et al. | 437/86 |
| 5,028,558 | 7/1991 | Haisma et al. | 437/62 |
| 5,034,343 | 7/1991 | Rouse et al. | 437/86 |
| 5,036,021 | 7/1991 | Goto | 437/62 |
| 5,147,808 | 9/1992 | Pronko | 437/21 |
| 5,213,986 | 5/1993 | Pinker et al. | 437/20 |
| 5,234,535 | 8/1993 | Beyer et al. | 156/630 |
| 5,266,135 | 11/1993 | Short et al. | 156/87 |
| 5,334,273 | 8/1994 | Short et al. | 156/87 |
| 5,334,524 | 8/1994 | Sharma et al. | 156/630 |
| 5,362,667 | 11/1994 | Linn et al. | 437/62 |
| 5,366,924 | 11/1994 | Easter et al. | 437/63 |
| 5,387,555 | 2/1995 | Linn et al. | 437/225 |
| 5,395,788 | 3/1995 | Abe et al. | 437/61 |
| 5,407,856 | 4/1995 | Quenzer et al. | 437/61 |
| 5,527,724 | 6/1996 | Brady | 437/24 |

FOREIGN PATENT DOCUMENTS 2-049466  2/1990  Japan .

*Primary Examiner*—Chris Eisenschenk
*Assistant Examiner*—Mary K Zeman
*Attorney, Agent, or Firm*—Fliesler, Dubb, Meyer & Lovejoy LLP

[57] ABSTRACT

A silicon on insulator (SOI) process is disclosed which includes the steps of forming an etch stop layer in a starting wafer, forming an insulating layer on the etch stop layer, bonding this wafer to a handle wafer, thinning the start wafer down to the etch stop and then recovering a device layer from the etch stop layer by outgassing dopants from the etch stop layer.

13 Claims, 8 Drawing Sheets

SILICON ON INSULATOR PROCESS WITH RECOVERY OF A DEVICE LAYER FROM AN ETCH STOP LAYER

BACKGROUND OF THE INVENTION

1. Field of the Invention

The present invention pertains to the field of integrated circuit device manufacturing processes. More particularly, this invention relates to silicon on insulator processes.

2. Art Background

A prior technique for manufacturing integrated circuit devices involves the formation of devices onto a substrate consisting of a silicon layer disposed on an insulating layer. Such a process may be referred to as a silicon on insulator (SOI) process. Typically, the silicon layer of such a substrate provides a device layer for forming devices such as transistors.

Typically, an SOI process provides reduced substrate capacitance in comparison to other processes. Such reduced substrate capacitance usually improves the quality of transistor devices formed on the substrate. In addition, an SOI process typically provides improved isolation between devices in comparison to other processes. SOI processes are particularly well-suited for manufacturing complimentary metal oxide semiconductor (CMOS) field effect transistors (FET). An SOI process typically facilitates the formation of fully depleted regions for such FETs.

One prior SOI process provides a layer of sapphire as the insulating layer for an SOI substrate. Typically in such a sapphire based SOI process, a silicon layer is epitaxially formed on top of the sapphire layer. The combination of the sapphire layer the silicon epitaxial layer provides an SOI substrate for subsequent formation of devices such as transistors.

Unfortunately, the sapphire required for such an SOI process usually increases the overall manufacturing cost of integrated circuits formed thereon. In addition, the aluminum contained within the sapphire layer may contaminate the silicon epitaxial layer during the high temperature process steps employed during device formation on the substrate. As a consequence, such a sapphire based SOI process usually imposes limits on the available process steps for subsequent device formation. Moreover, an epitaxial formation of silicon on top of a non-silicon substance such as sapphire typically reduces the quality of the silicon layer due to a lattice structure mismatch between the silicon and the sapphire crystal structures.

Another prior SOI process is referred to as the separation by implantation of oxygen (SIMOX) process. The insulating substrate layer in a SIMOX process is typically formed by heating a silicon wafer to a moderate temperature while oxygen is implanted into the silicon wafer at a high energy This implant is subsequently annealed at high temperature to yield a buried layer of oxygen within the silicon wafer. Oxygen precipitates to form the oxide layer which provides a buried insulating layer beneath a silicon device layer.

Unfortunately, SIMOX processes are usually expensive due to the high cost of providing a high current implanter that forms the buried oxide layer. In addition, such high current implantation of oxygen typically requires large amounts of electricity which also increases manufacturing costs. Moreover, SIMOX processes typically require a high temperature anneal step which may cause oxygen precipitates to form outside the buried insulating layer and in the device layer. Such oxygen precipitants located in the device layer typically degrade the performance of transistor devices formed on the device layer.

Yet another prior SOI process is referred to as a bonded etched-back silicon on insulator (BESOI) process. A typical BESOI process begins with a silicon wafer which is subjected to a high dose boron implant to form an etch stop layer. Typically, the etch stop layer is doped with extremely high concentrations of boron in excess of 1E20 per cubic centimeter. An epitaxial layer of silicon is usually grown on top of the etch stop layer. A separate handle wafer having an oxide layer formed thereon is typically bonded to the silicon epitaxial layer. Thereafter, a KOH etching process is usually employed to etch away the lightly doped silicon down to the etch stop layer. An HF nitric acetic chemical process is then used to preferentially etch away the etch stop layer which yields a resulting silicon device layer on an insulating oxide layer.

Unfortunately, such a BESOI process usually creates defects in the resulting wafer film due to the high boron concentrations used in the process. High boron concentrations can cause deformation of the substrate and consequential degradation in the quality of devices formed thereon. In addition, a BESOI process typically requires the formation of an epitaxial silicon layer in addition to an etch stop layer which is later discarded. Such extra process steps in the BESOI process usually increases overall manufacturing costs.

SUMMARY AND OBJECTS OF THE INVENTION

One object of the present invention is to provide a silicon on insulator manufacturing process.

Another object of the present invention is to provide a silicon on insulator process suitable for the formation of ultra-thin silicon device layers.

A further object of the present invention is to provide a silicon on insulator process that recovers a silicon device layer from an etch stop layer, These and other objects are provided by a silicon on insulator (SOI) process which includes the steps of forming an etch stop layer in a starting wafer, bonding this wafer with the etch stop layer to an oxidized handle wafer, removing the lightly doped silicon in KOH down to the etch stop layer and then recovering the device layer from the etch stop layer. The etch stop layer in one embodiment is formed by implanting a dopant boron into the starting wafer through an oxide layer grown on the starting wafer. After thinning to the etch stop in KOH, the device layer is recovered by outgassing the dopant from the etch stop layer. The concentration of the dopant in the etch stop layer is selected to provide elastic deformation of the starting wafer during processing. This is possible for etch stop layers thinner than a few thousand angstroms.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
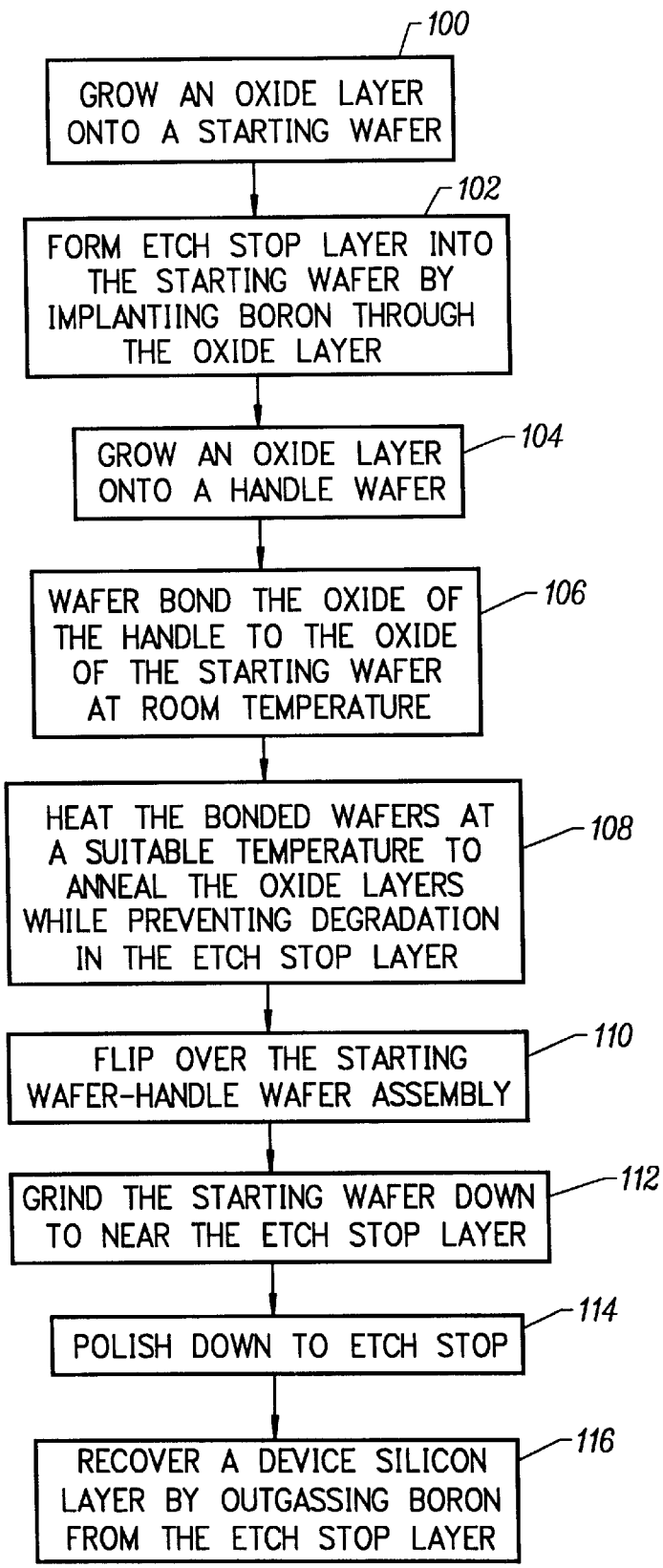
FIG. 1 illustrates a process for forming a silicon on insulator wafer substrate for one embodiment.

FIG. 1 illustrates a process for forming a silicon on insulator wafer substrate for one embodiment. At process step 100 an oxide layer is grown onto a starting wafer.

Figure 2:
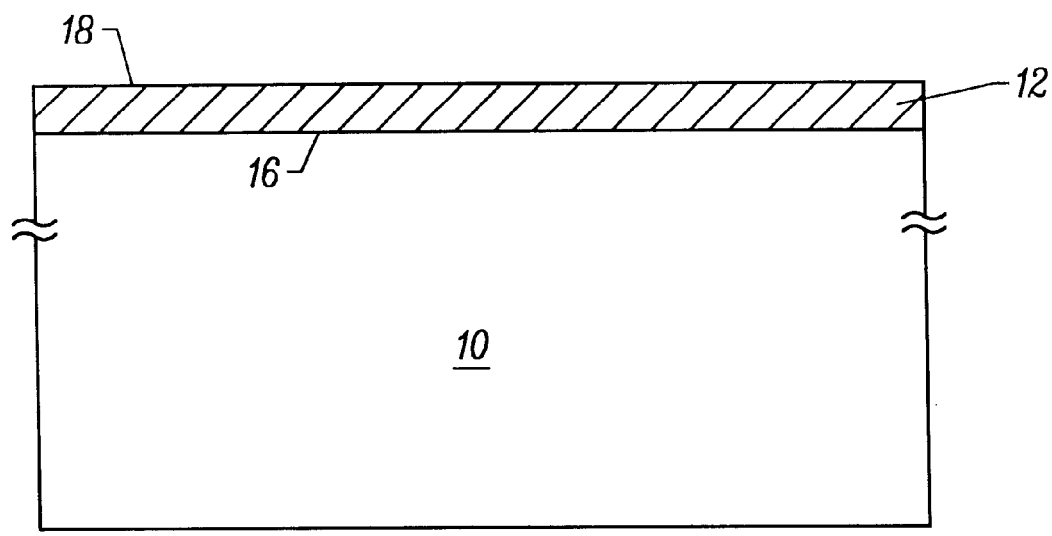
FIG. 2 illustrates a starting silicon wafer with a smoothly polished surface and an oxide layer formed thereon.

FIG. 2 illustrates a starting wafer 10 at the process step 100. The starting wafer 10 is a silicon wafer with a smoothly polished surface 16. An oxide layer 12 is formed onto the polished surface 16. The arrangement shown yields a relatively smooth profile of a surface 18 of the oxide layer 12 because the surface 16 of the starting wafer 10 is smooth from the polishing step.

At process step 102, an etch stop layer is formed into the starting wafer. For one embodiment, the etch stop layer is formed by implanting boron through the oxide layer on the starting wafer.

Figure 3:
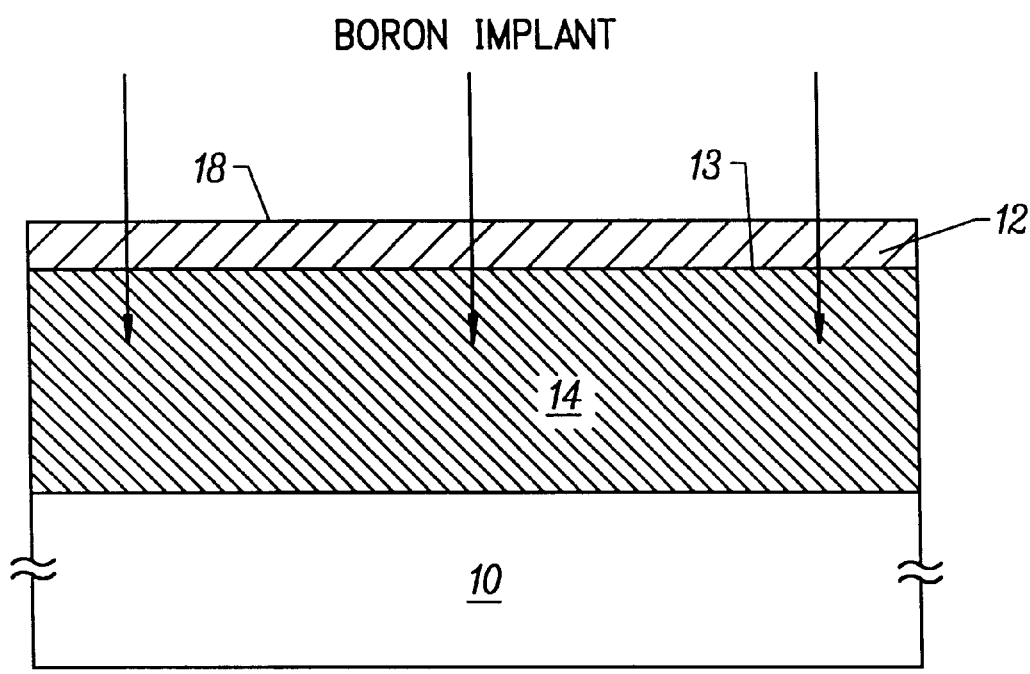
FIG. 3 illustrates the implantation of boron at high energy through the oxide layer which forms an etch stop layer in the starting wafer.

FIG. 3 illustrates the process step 102 for one embodiment. An implantation step is illustrated wherein boron is implanted at high energy through the oxide layer 12. The high energy implantation of boron forms an etch stop layer 14 in the starting wafer 10. The oxide layer 12 offers the advantage of accepting most of the damage caused by the boron implant into the starting wafer 10. In addition, the oxide layer 12 prevents the buildup of boron on surface 13 of the etch stop layer 14.

In an alternative embodiment, a low energy boron implant is directed into the starting wafer 10 without the presence of the oxide layer 12.

At process step 104, a handle wafer is formed and an oxide layer is grown onto the handle wafer.

Figure 4:
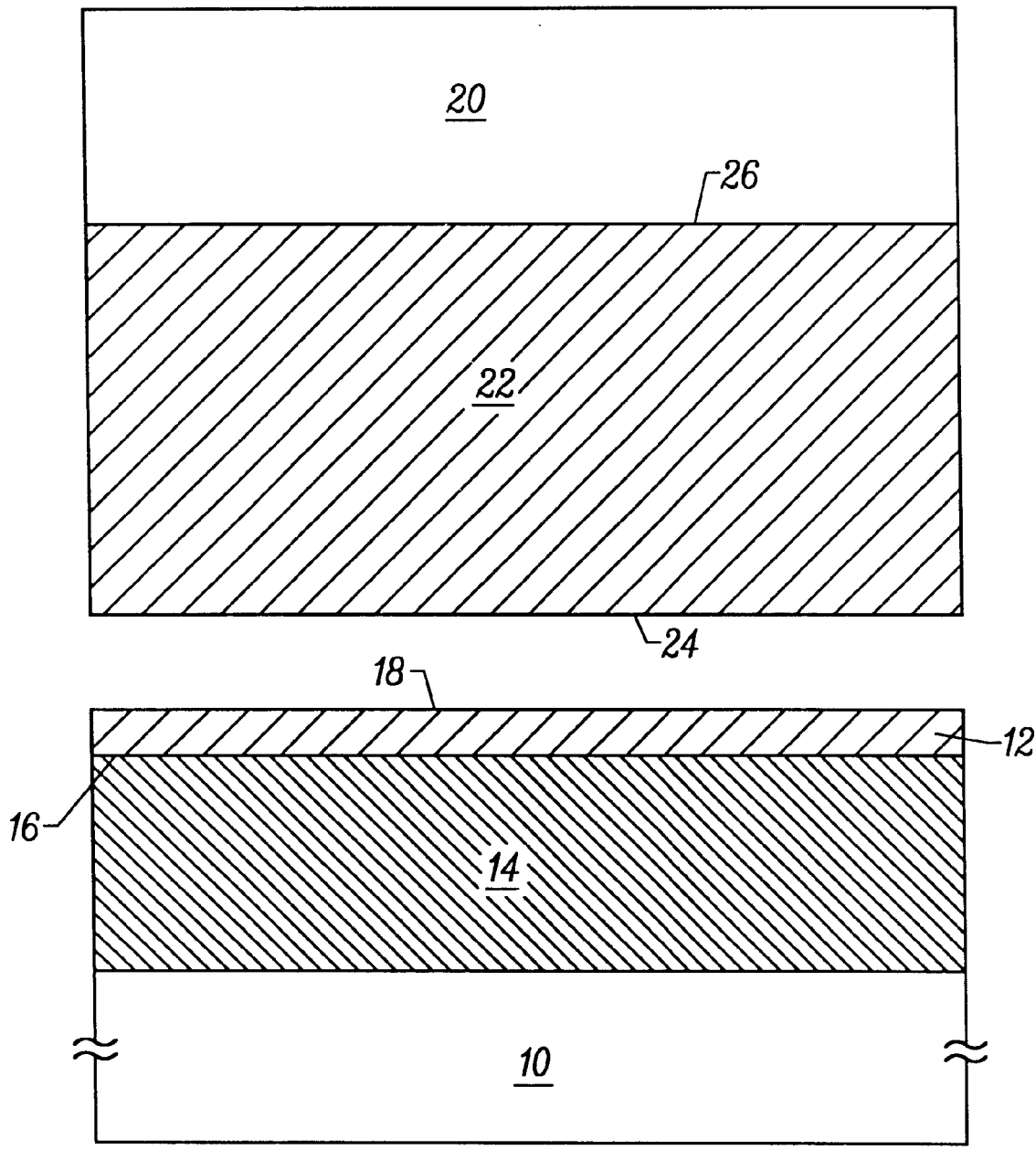
FIG. 4 illustrates a handle wafer with an oxide layer formed thereon.

FIG. 4 illustrates a handle wafer 20 with an oxide layer 22 formed thereon according to the process step 104. Prior to formation of the oxide layer 22, a surface 26 of the handle wafer 20 is polished to provide a smooth surface. The smoothly polished surface 26 yields a smooth surface 24 of the oxide layer 22 and provides a relatively flat surface for subsequent wafer bonding to the oxide layer 12.

The surface 24 of the oxide layer 22 and the surface 18 of the oxide layer 12 are each optically flat and are wafer bonded together at process step 106. The wafer bonding of the oxide layer 22 to the oxide layer 12 occurs at room temperature. To aid in the formation of a wafer bond, the surface 18 and the surface 24 are each treated with $H_2O$, or $H_2O_2$ or $H_2SO_4$. As a consequence of such treatment, OH groups form on the surfaces 18 and 24. The OH radicals or the hydroxyl groups on each surface 18 and 24 causes hydrogen bonding on the surfaces 18 and 24 as the oxide layers 18 and 22 are brought together at room temperature to form a bonded wafer assembly.

At process step 108, the bonded wafer assembly formed at step 106 is heated to a suitable temperature to anneal the bonded oxide layers 12 and 22 while preventing degradation in the etch stop layer 14.

Figure 5:
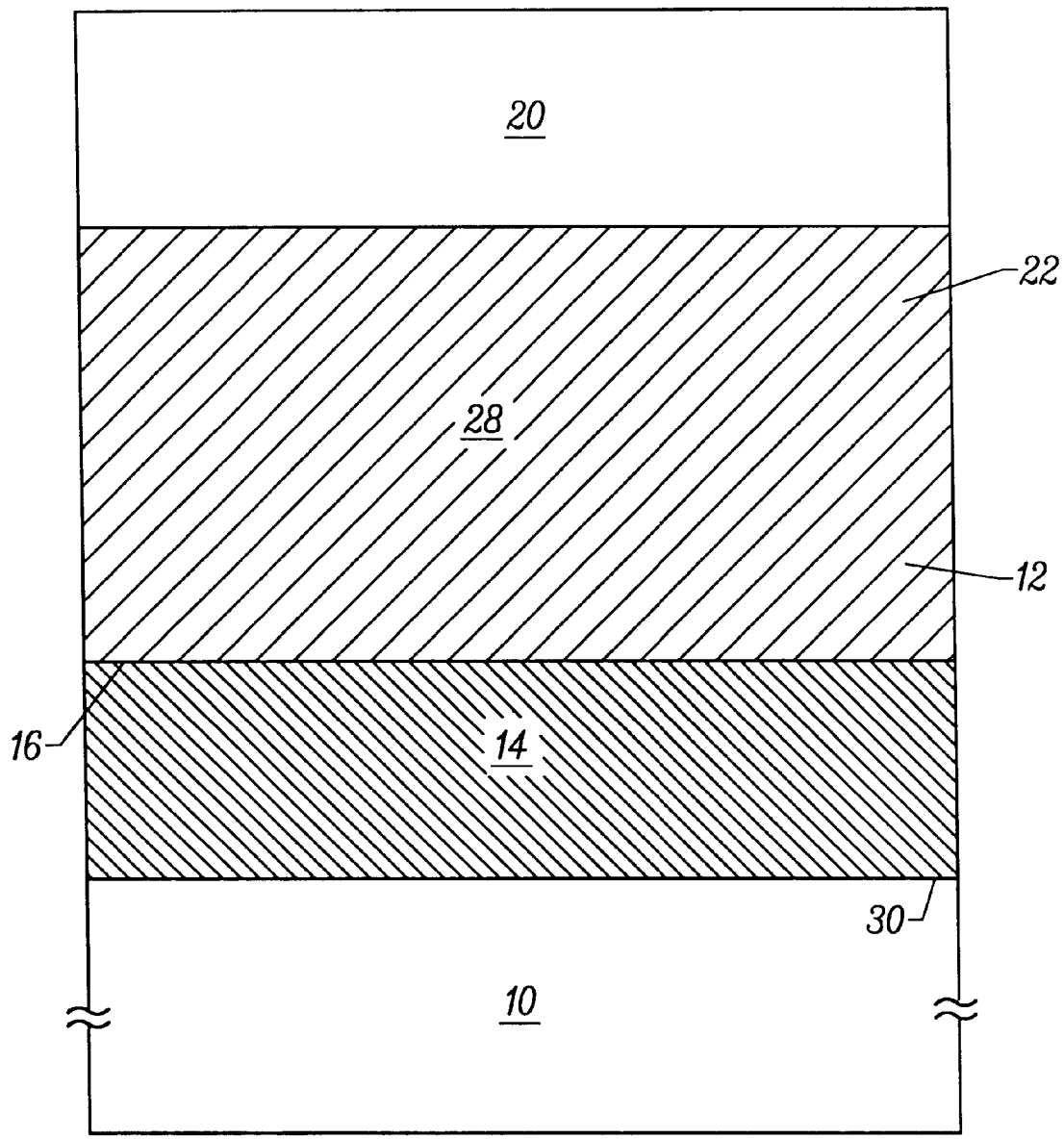
FIG. 5 illustrates a bonded wafer assembly after annealing which yields a uniform oxide layer from the oxide layers on the starting wafer and handle wafer.

FIG. 5 illustrates the bonded wafer assembly after annealing at the process step 108. The relatively high temperature anneal step at the process step 108 yields a uniform oxide layer 28 from the oxide layers 22 and 12. The annealing at the process step 108 is performed at as low a temperature as is required to anneal the oxide layers 12 and 22 into the uniform oxide layer 28 while preventing degradation in the etch stop layer 14. Degradation of the etch stop layer 14 could otherwise occur by diffusion of boron out of the etch stop layer 14 if excessively high temperatures are employed during the process step 108.

For one embodiment, the process step 108 is performed at a temperature 1000° centigrade which provides suitable annealing while preventing undesirable diffusion of boron from the etch stop layer 14. The heating at the process step 108 is applied in a diffusion furnace with a nitrogen, oxygen, or steam atmosphere. The atmosphere at the process step 108 is less of a concern because the reactive layers 12 and 22 are buried by the starting wafer 10 and handle wafer 20. The edges of the starting wafer 10 and the handle wafer 20 may be tacked down by oxidation in order to prevent edge delamination of silicon layer 10 during mechanical thinning.

In another embodiment, the process step 108 is performed by a rapid thermal annealer.

At process 110, the assembly comprising the starting wafer 10, the handle wafer 20, the etch stop layer 14, and the oxide layer 28 is flipped over to provide access to the starting wafer 10 and subsequently access to a surface 30 of the etch stop layer 14.

For one embodiment, a grinding technique is used to grind down the starting wafer 10 to a location near the surface 30 of the etch stop layer 14 during process step 112. Thereafter at process step 114, a polishing technique is used to polish away the remainder of the starting wafer 10 down to the surface 30 of the etch stop layer 14.

The polishing technique at the process step 114 is a combination mechanical and chemical process. The rate of removal with this polishing process is much lower for the etch stop layer 14 than for the starting wafer 10. Therefore, the etch stop layer 14 may also be referred to as a polish stop layer. For one embodiment, the polishing at the process step 114 is performed with a polyethylene pad and a slurry with a pH factor of approximately 10. For example, the slurry may comprise KOH or sodium hydroxide mixed with colloidal silica. If the mechanical components of the slurry are reduced to provide minimal mechanical removal, then the process step 114 provides primarily chemical polishing down to the surface 30 of the etch stop layer 14.

Figure 6:
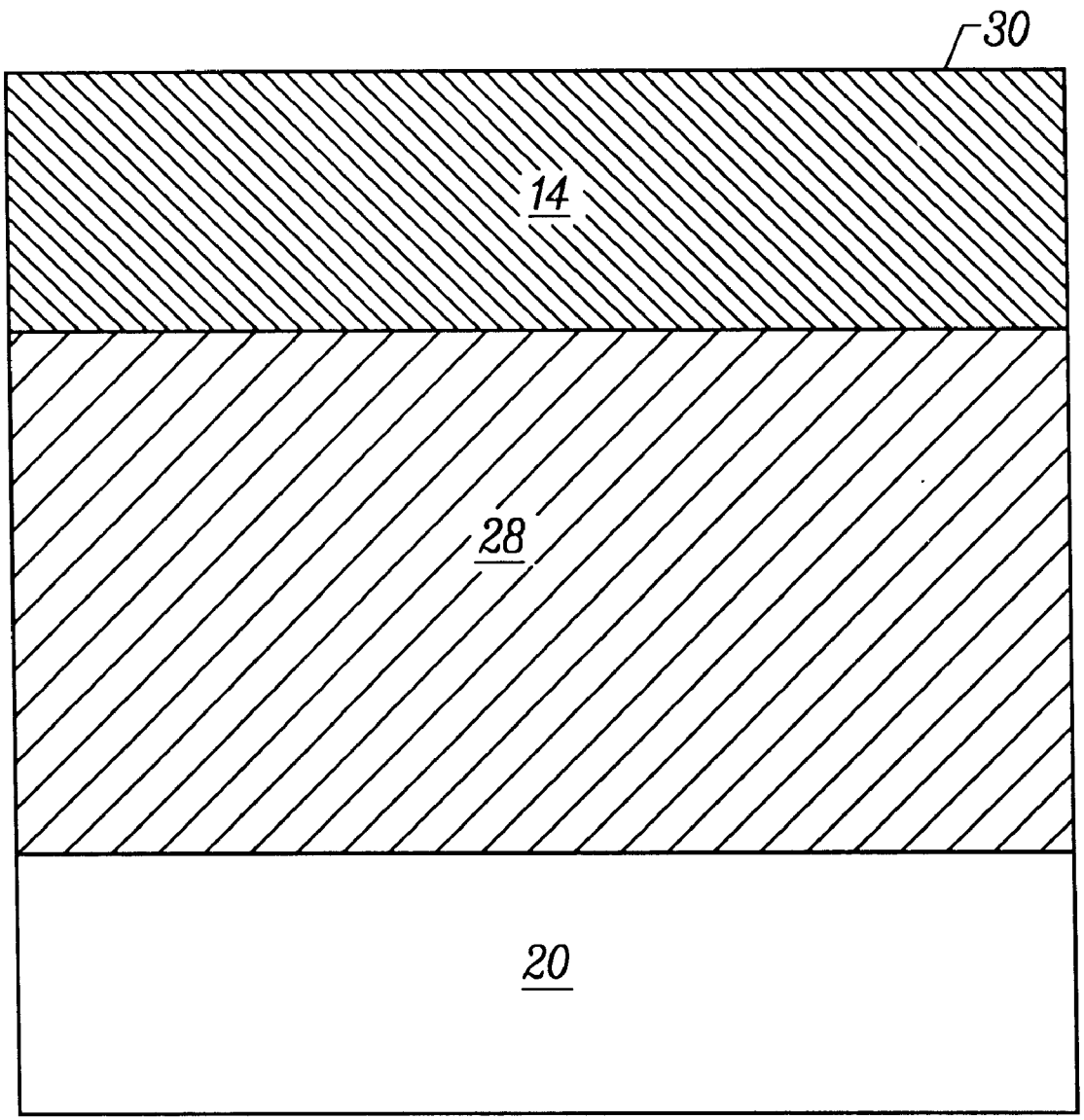
FIG. 6 illustrates the bonded wafer assembly after polishing down to a surface of the etch stop layer which provides an optically flat surface.

FIG. 6 illustrates the bonded wafer assembly after polishing at process step 114. The surface 30 of the etch stop layer 14 provides an optically flat device grade surface that may be used for device formation once the device layer is recovered from the etch stop layer 14.

In an alternative embodiment a KOH chemical etch is used to remove the starting wafer 10 down to the surface 30 of the etch stop layer 14.

In yet another embodiment, a KOH chemical etch is used to etch down the starting wafer 10 to near the surface 30 and thereafter a polishing technique is used to polish down to the surface 30. The grinding technique at the process step 112 or the alternative KOH chemical etch removes the starting wafer 10 down to within 10 or 15 microns of the surface 30 of the etch stop 14 in preparation for the polishing step that forms a smooth and optically flat surface 30 of the etch stop layer 14.

At process step 116, a device silicon layer is recovered from the etch stop layer 14 by outgassing boron dopants from the etch stop layer 14.

Figure 7:
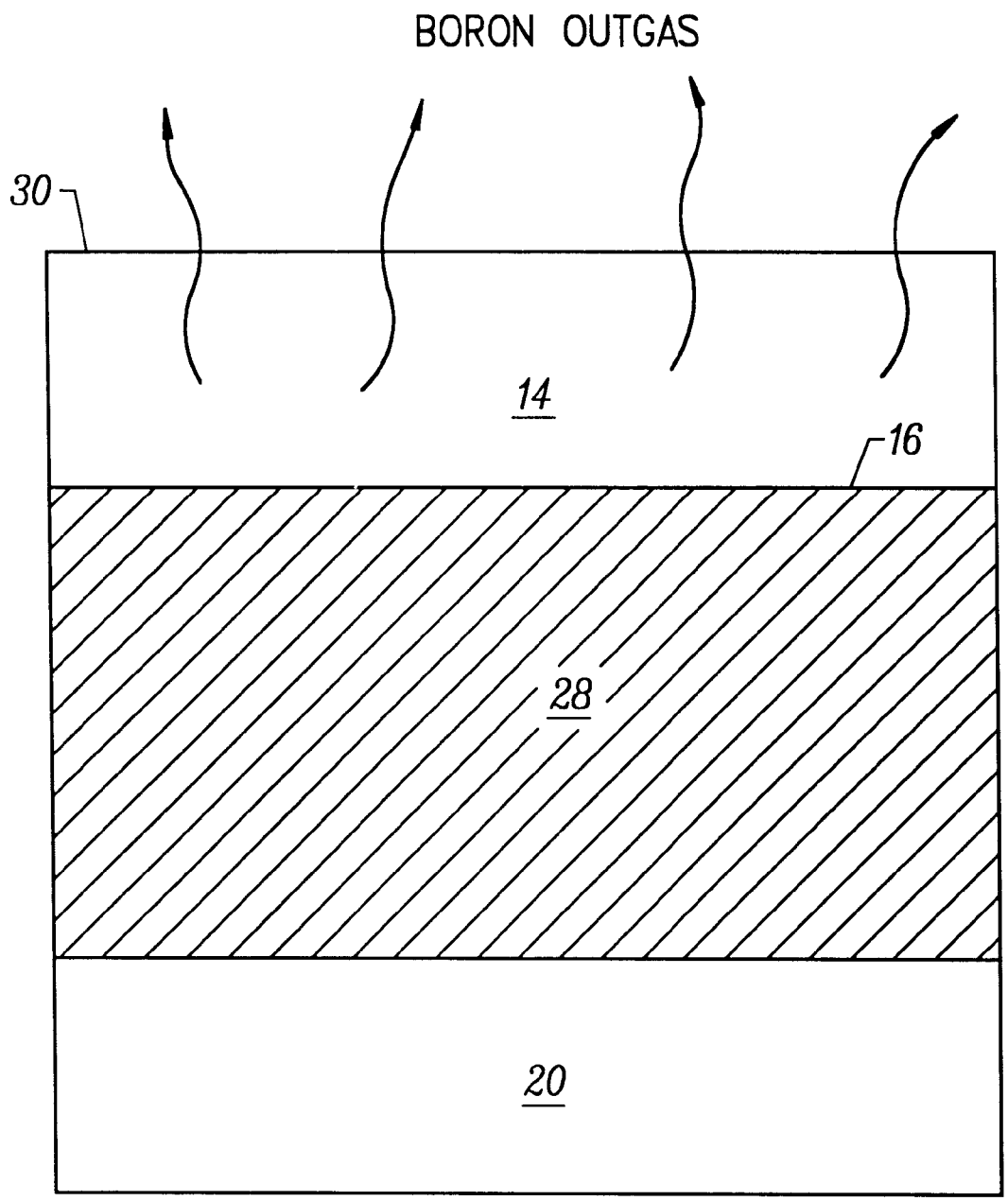
FIG. 7 illustrates a boron outgassing step that recovers a device layer from the etch stop layer.

FIG. 7 illustrates the process step 116. In one embodiment, the outgassing at the process step 116 is performed in a furnace with a neutral ambient atmosphere at a temperature of approximately 1175° centigrade. The ambient atmosphere of the furnace may comprise argon gas which prevents damage to the surface 30 during boron outgassing.

Figure 8:
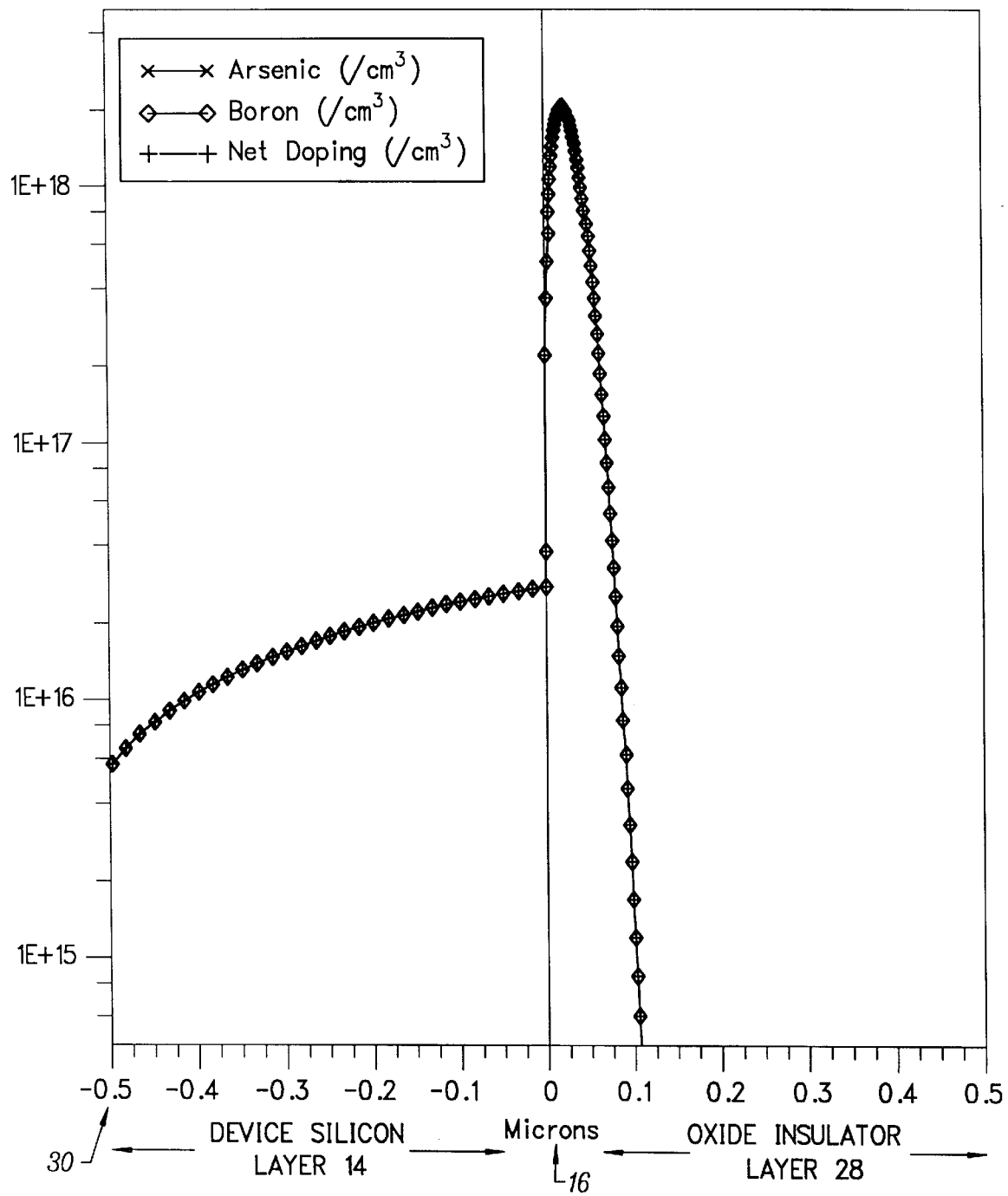
FIG. 8 illustrates the boron concentration of the recovered device silicon layer after five hours of outgassing in one embodiment.

FIG. 8 illustrates the boron concentration of the device silicon layer 14 after five hours of outgassing at 1175° centigrade during the process step 116. For one embodiment, the device silicon layer 14 starts out as a 5000 angstrom layer of silicon which is uniformly doped to 1E20 per cubic centimeter boron concentration. This thickness and doping are beyond the most difficult case required for outgassing. After five hours outgassing at 1175° the boron concentration profile is as shown between the surfaces 16 and 30 of the device silicon layer 14. Such a boron concentration profile provides a resulting wafer that is suitable for forming NMOS partially depleted devices. Less time at temperature is required to recover a 1000 angstrom device layer. For example, a boron concentration of 1E16 to 2E16 per cubic centimeter with a device layer of 1000 angstroms can yield a submicron FET with a 600 millivolt threshold voltage.

Figure 9:
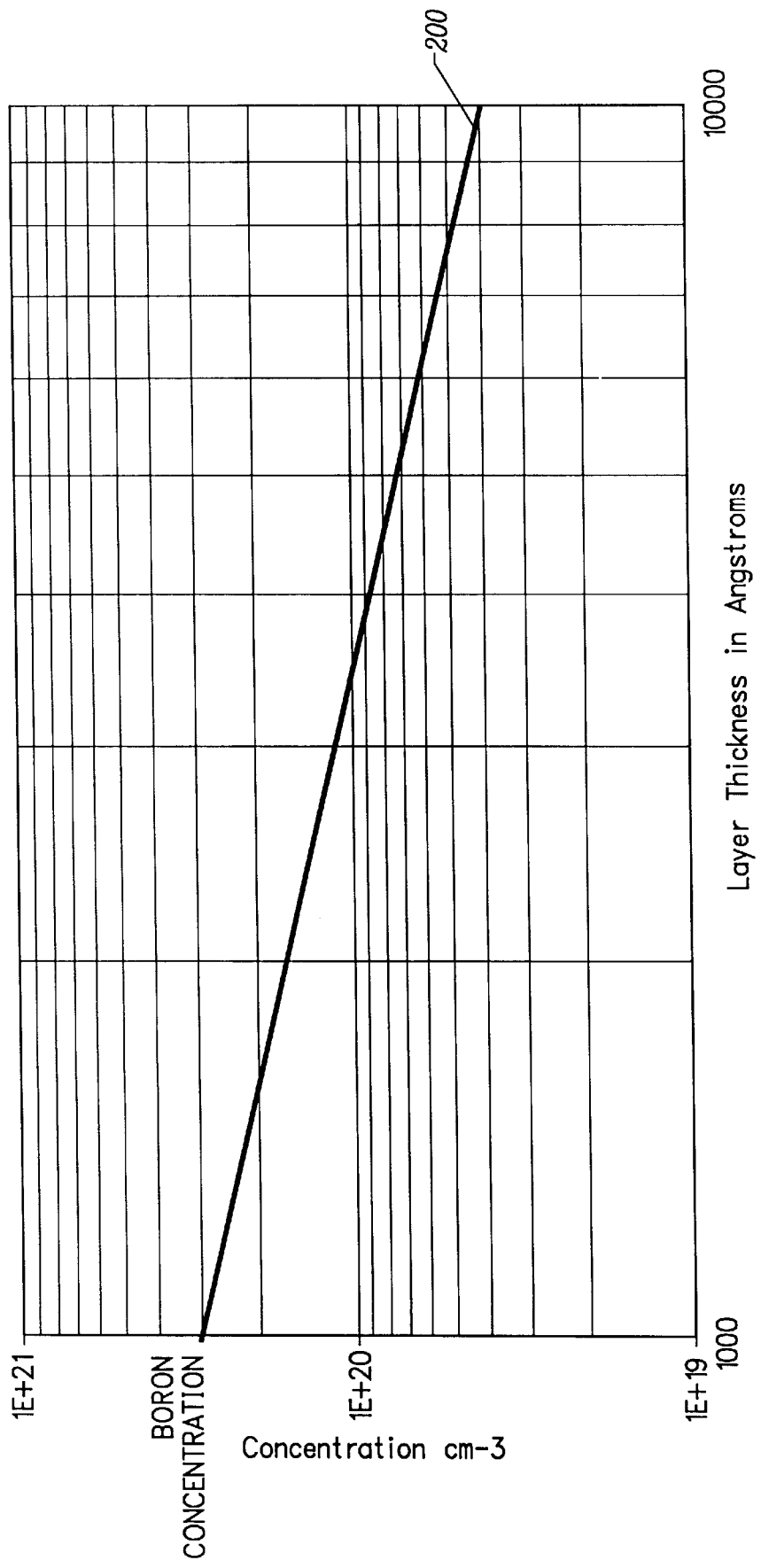
FIG. 9 is a graph that illustrates acceptable boron doping concentrations of the etch stop layer in relation to the thickness of the etch stop layer for one embodiment.

FIG. 9 is a graph that illustrates acceptable boron doping concentrations of the etch stop layer 14 in relation to the thickness of the etch stop layer 14. A line 200 indicates maximum boron concentrations for a given thickness of the etch stop layer 14 that will yield elastic deformation in the wafer containing the etch stop layer 14 and prevent defects in the wafer after the outgassing at the process step 116. The slope of the line 200 shows the present SOI process is particularly suitable for forming ultra-thin silicon layers when boron is employed in the etch stop layer 14. Thinner etch stop layers allow increased concentration of boron dopants while providing elastic deformation of the wafer during the process steps disclosed herein.

In an alternative embodiment, the etch stop layer 14 is formed with both boron and germanium dopants to balance the deformations in the etch stop layer 14 during the process steps disclosed herein. In this embodiment a silicon-germanium alloy is recovered from the etch stop layer 14 after the outgassing at the process step 116.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A silicon on insulator (SOI) process, comprising the steps of:

providing a silicon starting wafer having a surface;

forming an insulating layer on the surface;

forming an etch stop layer in a starting wafer by implanting a dopant into the silicon of the starting wafer;

bonding the insulating layer to a second insulating layer on a surface of a handle wafer;

removing a portion of the starting wafer; and recovering a device layer from the etch stop layer by outgassing the dopant from the silicon, wherein a resulting dosage of the dopant and a depth for implanting the dopant, and the recovering step are chosen to result in a device layer having a desired concentration of the dopant.

2. The SOI process of claim 1, wherein the step of forming the etch stop layer comprises the steps of:

growing an oxide layer onto the starting wafer;

implanting the dopant into the starting wafer through the oxide layer on the starting wafer.

3. The SOI process of claim 2, wherein a concentration of the dopant in the etch stop layer is selected to provide elastic deformation of the starting wafer.

4. The SOI process of claim 3, wherein the dopant is boron.

5. The SOI process of claim 3, wherein the dopant comprises boron and germanium at concentrations that provide minimal elastic deformation in the starting wafer.

6. The SOI process of claim 1, wherein the step of bonding further comprises the step of annealing the second insulating layer on the handle wafer with the insulating layer on the starting wafer.

7. The SOI process of claim 6, wherein the step of annealing is performed at a temperature high enough to anneal the insulating layers and low enough to prevent degradation of the etch stop layer.

8. The SOI process of claim 6, wherein the step of annealing is performed in a diffusion furnace.

9. The SOI process of claim 6, wherein the step of annealing is performed in a rapid thermal annealer.

10. The SOI process of claim 6, further comprising the step of removing a remainder of the starting wafer from the etch stop layer.

11. The SOI process of claim 10, wherein the step of removing the remainder of the starting wafer comprises the steps of:

grinding the starting wafer down to a position near a surface of the etch stop layer;

polishing the remainder of the starting wafer down to the surface of the etch stop layer.

12. The SOI process of claim 10, wherein the step of removing the remainder of the starting wafer comprises the steps of:

etching the starting wafer down to a position near a surface of the etch stop layer;

polishing the remainder of the starting wafer down to the surface of the etch stop layer.

13. The SOI process of claim 10, wherein the step of removing the remainder of the starting wafer comprises the step of polishing the remainder of the starting wafer down to the surface of the etch stop layer.

* * * * *